(12) United States Patent
Holzberg et al.

(10) Patent No.: US 9,283,994 B2
(45) Date of Patent: Mar. 15, 2016

(54) METHOD FOR ACTUATING A CLOSURE ELEMENT ARRANGEMENT, IN PARTICULAR OF A MOTOR VEHICLE

(71) Applicant: Brose Fahrzeugteile GmbH & Co. KG, Hallstadt, Hallstadt (DE)

(72) Inventors: Frank Holzberg, Koenigsberg (DE); Udo Geuther, Bamberg (DE)

(73) Assignee: Brose Fahrzeugteile GmbH & Co. KG, Hallstadt, Hallstadt (DE)

( * ) Notice: Subject to any disclaimer, the term of this patent is extended or adjusted under 35 U.S.C. 154(b) by 0 days.

(21) Appl. No.: 13/951,163

(22) Filed: Jul. 25, 2013

(65) Prior Publication Data

US 2014/0032055 A1     Jan. 30, 2014

(30) Foreign Application Priority Data

Jul. 25, 2012  (DE) .......................... 10 2012 014 676

(51) Int. Cl.
*B62D 25/12*       (2006.01)
*H03K 17/955*     (2006.01)
(Continued)

(52) U.S. Cl.
CPC ............ *B62D 25/12* (2013.01); *B60R 25/2054* (2013.01); *H03K 17/955* (2013.01);
(Continued)

(58) Field of Classification Search
CPC ...... B62D 25/12; H03K 17/955; B60R 25/04; B60R 25/1004; B60R 25/2036; G07C 9/00658; E05B 81/78; E05F 15/73; G01D 5/2291; G01D 5/2405; B60D 1/36; B60D 1/465; G08B 13/126; F41H 5/007; G09B 19/16; G09B 9/04

USPC .................. 701/1, 49, 29.2; 324/207.18, 662; 434/69; 340/540
See application file for complete search history.

(56) References Cited

U.S. PATENT DOCUMENTS 5,844,486 A     12/1998  Barron et al.
6,275,146 B1    8/2001   Kithil et al.
(Continued)

FOREIGN PATENT DOCUMENTS

DE    102004055982    6/2006
EP    0711977         5/1996
(Continued)

OTHER PUBLICATIONS

Search Report for German Application No. 102012014676.0 corresponding to U.S. Appl. No. 13/951,163, mailed Jan. 18, 2013 (5 pages).
(Continued)

*Primary Examiner* — Tuan C. To
*Assistant Examiner* — Yuri Kan
(74) *Attorney, Agent, or Firm* — Pauly, Devries Smith & Deffner, LLC

(57) ABSTRACT

A method for actuating a closure element arrangement, of a vehicle, wherein the closure element arrangement has a control system having a controller and a sensor arrangement. The sensor arrangement has at least one elongate distance sensor with a sensor extent, wherein a distance A from a user B can be detected with respect to the sensor extent with the distance sensor, which user B is located at a longitudinal position along the sensor extent. At least two elongate sensor sections, of the at least one distance sensor are provided, which sensor sections are each configured to detect a distance A from a user B, that the sensor sections have changing sensor configurations along the sensor extent, and that the longitudinal position of the user B is determined as a function of the sensor measured values of the at least two sensor sections by means of the controller.

20 Claims, 5 Drawing Sheets

(51) Int. Cl.
   *E05B 81/78* (2014.01)
   *E05F 15/73* (2015.01)
   *B60R 25/20* (2013.01)
   *H03K 17/96* (2006.01)

(52) U.S. Cl.
   CPC ........... *E05F 15/73* (2015.01); *E05Y 2400/858* (2013.01); *E05Y 2900/546* (2013.01); *H03K 2017/9602* (2013.01); *H03K 2017/9613* (2013.01); *H03K 2217/96078* (2013.01)

(56) References Cited

U.S. PATENT DOCUMENTS

| | | | |
|---|---|---|---|
| 7,880,481 B2 | 2/2011 | Zangl et al. | |
| 8,606,467 B2 | 12/2013 | Gehin | |
| 8,788,152 B2 | 7/2014 | Reimann et al. | |
| 9,081,032 B2 | 7/2015 | Lange | |
| 2002/0030666 A1 | 3/2002 | Philipp et al. | |
| 2004/0085079 A1* | 5/2004 | Lin et al. | 324/662 |
| 2005/0114276 A1 | 5/2005 | Hunter et al. | |
| 2005/0231194 A1* | 10/2005 | Baldi et al. | 324/207.18 |
| 2006/0293800 A1* | 12/2006 | Bauer et al. | 701/1 |
| 2007/0072154 A1* | 3/2007 | Akatsuka et al. | 434/69 |
| 2008/0195273 A1* | 8/2008 | Matsuura et al. | 701/34 |
| 2010/0256875 A1 | 10/2010 | Gehin | |
| 2011/0118946 A1* | 5/2011 | Reimann et al. | 701/49 |
| 2011/0276234 A1* | 11/2011 | Van Gastel | 701/49 |
| 2012/0188078 A1* | 7/2012 | Soles et al. | 340/540 |
| 2013/0234733 A1 | 9/2013 | Lange et al. | |
| 2014/0324273 A1 | 10/2014 | Russ et al. | |
| 2015/0019085 A1 | 1/2015 | Ma | |

FOREIGN PATENT DOCUMENTS

| | | |
|---|---|---|
| EP | 2285629 | 3/2012 |
| FR | 2943190 | 9/2010 |
| JP | 2002514986 | 5/2002 |
| JP | 2010531268 | 9/2010 |
| WO | 2007006514 | 1/2007 |
| WO | 2012052210 | 4/2012 |
| WO | 2012084111 | 6/2012 |
| WO | 2013034252 | 3/2013 |

OTHER PUBLICATIONS

Brose Fahrzeugteile Gmbh & Co.KG, "Sesam oeffne Dich. In: AutomobilKONSTRUKTION," Feb. 22, 2012 (pp. 50-51), retrieved from http://www.industrie.de/industrie/live/index2.php?mend=&submenu=3&object_id=32930658, including English translation from http://translate.gogle.com retrieved Mar. 17, 2015.

"Search Report," for German Application No. 102012014676.0 corresponding to U.S. Appl. No. 13/951,163, mailed Jan. 18, 2013 (5 pages).

European Search Report for EP Application No. 13713812.2 corresponding to U.S. Appl. No. 13/951,163 dated Oct. 31, 2013 (3 pages).

Office Action for KR Patent Application No. 10-2013-0087175 corresponding to U.S. Appl. No. 13/951,163 dated Jan. 21, 2015 (13 pages).

\* cited by examiner

METHOD FOR ACTUATING A CLOSURE ELEMENT ARRANGEMENT, IN PARTICULAR OF A MOTOR VEHICLE

CLAIM OF PRIORITY

This application claims the benefit of German Patent Application No. DE 10 2012 014 676.0, filed Jul. 25, 2012, the disclosure of which is incorporated by reference herein in its entirety.

FIELD OF THE INVENTION

The invention relates to a method for actuating a closure element arrangement of a motor vehicle.

BACKGROUND

Closure elements which can be actuated by motor have gained widespread acceptance in contemporary motor vehicles. Such closure elements may be, for example, doors, such as side doors and rear doors, in particular sliding doors, flaps, in particular tailgates, boot lids, engine bonnets, luggage compartment spaces or the like of a motor vehicle. The term "closure element" is therefore to be understood in a broad sense here.

In the known method (DE 10 2010 055 297 A1) the triggering of the motor activation of the closure element on which the invention is based can be brought about in a particularly convenient way by a movement of the user's foot. For this, a control system having a controller and a sensor arrangement is provided which has two elongate, capacitive distance sensors. The sensor measured values of the two distance sensors are monitored by means of the controller to determine whether the user has carried out a predetermined foot movement. When such an operator control event is detected, the drive arrangement is actuated correspondingly, here the assigned tailgate or the like is opened or closed by motor.

The reliability of the operator control event monitoring operation constitutes a challenge with respect to the implementation of the known method. A reason for this is that the capacitive distance sensors which are used here are configured only to detect the distance from the user transversely with respect to the sensor extent. This can lead to a situation in which the user running past along the sensor extent, possibly accompanied by the user moving closer to the distance sensor, can incorrectly be detected as an operator control event. The controller has, of course, no information as to whether a movement of the user along the sensor extent occurs.

The position of the user along the sensor extent is referred to below as "longitudinal position". This means that the user is located on any path which runs parallel to the sensor extent. In any longitudinal position, the user can assume any desired distance from the distance sensor. It should be noted at this point that the sensor extent is not necessarily a straight line. Instead, the sensor extent can be located on any desired paths, that is to say can also be curved.

The implementation of the known method also constitutes a challenge because contemporary motor vehicles can be equipped with a large number of attachment components, in particular with trailer couplings, bicycle racks or the like which disrupt the detection of operator control events by sensor. For example, an operator control event monitoring operation is virtually impossible with the known method if the user is located in a longitudinal position in which the trailer coupling has also been mounted.

The invention is based on the problem of configuring and developing the known method in such a way that the reliability of the operator control event monitoring operation is improved using said means.

SUMMARY

The above problem is solved with a for actuating a closure element arrangement of a motor vehicle.

The basic idea is to use the at least one distance sensor, which is provided in any case for the operator control event monitoring operation, to determine the longitudinal position of the user. With the information which is acquired in this way about the longitudinal position of the user it is possible, for example, to determine whether the user is merely passing the distance sensor or whether the user performs an operator control event. In addition, with the proposed solution it is possible to define an operator control event which is to be monitored and which comprises a longitudinal movement of the user along the sensor extent.

Given a suitable configuration, during a longitudinal movement of the user along the sensor extent a characteristic time profile of the sensor measured values of the sensor sections may arise which can be, for example, in turn a component of an operator control event to be monitored.

It is to be noted that the term "longitudinal position" does not necessarily relate to the absolute longitudinal position of the user. Instead, the term "longitudinal position" is to be understood in a broad sense here. Said term comprises all the indications which make available a value for the longitudinal position of the user. The same applies to the understanding of the term "distance".

In particular, with respect to the determination of the longitudinal position of the user it is firstly proposed that at least two elongate sensor sections, running essentially one next to the other, of the at least one distance sensor be provided, which sensor sections are each configured to detect a distance from a user.

It is essential that the sensor sections have changing sensor configurations along the sensor extent, specifically in such a way that the longitudinal position of the user can be determined as a function of the sensor measured values of the at least two sensor sections by means of the controller. This means that in the case of a user who is in a longitudinal position it is possible to infer the longitudinal position of the user from a measured value pair of two sensor sections. The assignment can be a one-to-one assignment between the measured value pair and the longitudinal position. This one-to-one assignment is, however, not absolutely necessary in many applications.

According to a further embodiment it is proposed that the longitudinal position of the user is determined by means of the controller, and that the operator control event monitoring operation is modified as a function of the longitudinal position of the user.

According to the further teaching it is an essential fact that the operator control event monitoring operation is carried out differently as a function of the longitudinal position of the user. For example, in this way it is possible to ensure that in the event of the user being in the same longitudinal position as a mounted trailer coupling the operator control event monitoring operation is adapted to precisely this scenario. If the user then moves into a longitudinal position at which an attachment part is not located, the operator control event monitoring operation can be reset, for example, to a standard monitoring operation.

The reliability during the operator control event monitoring operation can also be improved with the further teaching, wherein any desired method, but the method according to the first-mentioned teaching, can be used for the determination of the longitudinal position.

An interesting fact relating to the two above-mentioned teachings is that the improvement of the reliability of the operator control event monitoring system can be implemented with extremely low expenditure. All that is necessary is to ensure that the two sensor sections each generate sensor measured values which together give an indication of the longitudinal position of the user.

In the simplest case, the determination of the longitudinal position of the user can be based on an arithmetic operation, in particular a division or a difference between the sensor measured values of two sensor sections. It is also conceivable that the longitudinal position of the user is based on the differences between the phase shifts between the voltage and current in the sensor measured values, in particular in so far as the sensor sections are each capacitive sensor elements to which an alternating voltage is applied.

The modification of the operator control event monitoring operation according to the teaching mentioned second can be implemented in a variety of ways. In an embodiment, the operator control event model on which the operator control event monitoring operation is based is modified as a function of the determined longitudinal position of the user. However, it is also conceivable, for example, that the algorithms or the like which are used for the signal evaluation are modified.

According to a further teaching, a control system for a closure element arrangement can exist.

According to this further teaching, the configuration of the above-mentioned sensor sections is significant such that the longitudinal position of the user can be determined as a function of the sensor measured values of the at least two sensor sections by means of the controller. It is possible here, as explained above, to dispense with a one-to-one assignment, depending on the application.

In an embodiment, the sensor configuration of a sensor section is based on its geometry, its position, its material composition or the like. Finally, the sensor configuration comprises any parameter which influences the sensor measured values of the sensor section.

In an embodiment, the changing of the sensor configuration is achieved by changing the geometry of the measuring electrode, in particular by changing the effective area of the measuring electrode. This is a variant which is easy to implement in terms of application technology. Additionally or alternatively, it is conceivable that the change in the sensor configuration to a corresponding change in the material composition of the measuring electrode is brought about, in particular, by a corresponding lining of the measuring electrode. As a result, a selected change in the sensor configuration can be achieved, even if the geometry has to remain unchanged because of peripheral structural conditions.

In one embodiment the invention provides a method for actuating a closure element arrangement of a motor vehicle, wherein the closure element arrangement has a closure element, a drive arrangement assigned to the closure element, and a control system having a controller and a sensor arrangement, wherein the sensor arrangement has at least one elongate distance sensor with a sensor extent, wherein a distance A from a user B can be detected transversely with respect to the sensor extent by means of the distance sensor, which user B is located at a longitudinal position L along the sensor extent, wherein the sensor measured values of the at least one distance sensor are monitored by means of the controller within the scope of an operator control event monitoring operation, to determine whether a predetermined operator control event occurs, and the drive arrangement is actuated as a function of the result of the operator control event monitoring operation, wherein at least two elongate sensor sections, running essentially one next to the other, of the at least one distance sensor are provided, which sensor sections are each configured to detect a distance A from a user B, in that the sensor sections have changing sensor configurations along the sensor extent, and in that the longitudinal position L of the user B is determined as a function of the sensor measured values of the at least two sensor sections by means of the controller.

In an embodiment, the longitudinal position L of the user B is determined by means of the controller, and in that the operator control event monitoring operation is modified as a function of the longitudinal position L of the user B.

In an embodiment, the determination of the longitudinal position L of the user B is based on an arithmetic operation between the sensor measured values of two sensor sections.

In an embodiment, the determination of the longitudinal position L of the user B is based on the difference between the phase shifts between the voltage and the current in the sensor measured values of two sensor sections.

In an embodiment, an operator control event model composed of signal characteristic values is assigned to an operator control event, in that within the scope of the operator control event monitoring operation by means of the controller it is monitored whether the sensor measured values correspond to the signal characteristic values of the operator control event model, and in that the operator control event model is generated as a function of the longitudinal position L of the user B, or selected as a function of the longitudinal position L of the user B from a number of stored operator control event models, or is parameterized as a function of the longitudinal position L of the user B.

In an embodiment, at least one operator control event is defined as a foot movement of the user.

In one embodiment the invention provides a control system for a closure element arrangement of a motor vehicle, wherein the closure element arrangement has a closure element and a drive arrangement assigned to the closure element, wherein the control system has a controller and a sensor arrangement, wherein the sensor arrangement has at least one elongate distance sensor with a sensor extent, wherein a distance A from a user B can be detected transversely with respect to the sensor extent by means of the distance sensor, which user B is located at a longitudinal position L along the sensor extent, wherein, within the scope of an operator control event monitoring operation, the controller monitors the sensor measured values of the sensor arrangement to determine whether a predetermined operator control event occurs and actuates the drive arrangement as a function of the result of the operator control event monitoring operation, wherein at least two elongate sensor sections, running essentially one next to the other, of the at least one distance sensor are provided, which sensor sections are each configured to detect a distance A from a user B, in that the sensor sections have changing sensor configurations along the sensor extent such that the longitudinal position L of the user B can be determined as a function of the sensor measured values of the at least two sensor sections by means of the controller.

In an embodiment, the current longitudinal position L of the user B can be determined exclusively as a function of the current sensor measured values of the at least two sensor sections by means of the controller.

In an embodiment, the change in the sensor configuration along the sensor extent is made in such a way that the longitudinal position L of the user B can be determined continuously along the sensor extent as a function of the sensor measured values of at least two sensor sections, or in that the change in the sensor configuration along the sensor extent is made in such a way that the longitudinal position L of the user B can be assigned to at least two different longitudinal sections along the sensor extent as a function of the sensor measured values of at least two sensor sections.

In an embodiment, the sensor sections each extend over the entire sensor extent, and/or in that a sensor section has a plurality of section parts.

In an embodiment, the at least one distance sensor is configured as a capacitive distance sensor and has at least one elongate measuring electrode which is composed of at least one electrical conductor.

In an embodiment, the sensor configuration of a sensor section is based on its geometry, its position, its material composition or the like.

In an embodiment, in order to change the sensor configuration the geometry of the measuring electrode changes along the sensor extent.

In an embodiment, in order to change the sensor configuration the material composition of the measuring electrode changes along the sensor extent.

In an embodiment, two distance sensors which run essentially one next to the other are provided, and in that one of the two distance sensors has the at least two sensor sections, or in that one distance sensor has one sensor section, and the other distance sensor has the other sensor section.

In an embodiment, the sensor configuration of the sensor section which changes along the sensor extent gives rise to a sensitivity profile of the sensor section which changes along the sensor extent.

In an embodiment, the determination of the longitudinal position L of the user B is based on a division of the sensor measured values of two sensor sections, or in that the determination of the longitudinal position L of the user B is based on the difference between the sensor measured values of two sensor sections.

In an embodiment, the at least one distance sensor is arranged in or on a rear cover part, in particular the rear bumper, of a motor vehicle.

In an embodiment, the at least one distance sensor extends over a substantial part of the width of the motor vehicle.

In an embodiment, the at least one operator control event is defined as a to and fro movement of the user's foot.

In an embodiment, during the operator control event the at least one distance sensor generates a pulse-like time profile of the sensor measured values.

In an embodiment, a trailer coupling, is located or mounted in a longitudinal section.

In an embodiment, the individual section parts are connected electrically in series.

In an embodiment, a first sensor section has a first measuring electrode and a second sensor section has a second measuring electrode.

In an embodiment, the effective area of the measuring electrode changes, continuously, along the sensor extent.

In an embodiment, a conductive lining with an ohmic resistance, changes continuously along the sensor extent.

BRIEF DESCRIPTION OF THE FIGURES

The invention will be explained in more detail below with reference to a drawing which illustrates only exemplary embodiments and in which.

DETAILED DESCRIPTION

The proposed method is explained below with reference to a closure element arrangement 1 of a motor vehicle which has a closure element 2 which is configured as a tailgate. In an embodiment, the configuration of the closure element 2 is a tailgate of a motor vehicle. However, reference is made to the introductory part of the description with respect to the broad understanding of the term "closure element". All the statements regarding a tailgate 2 correspondingly apply in this respect to all other types of closure elements.

Figure 1:
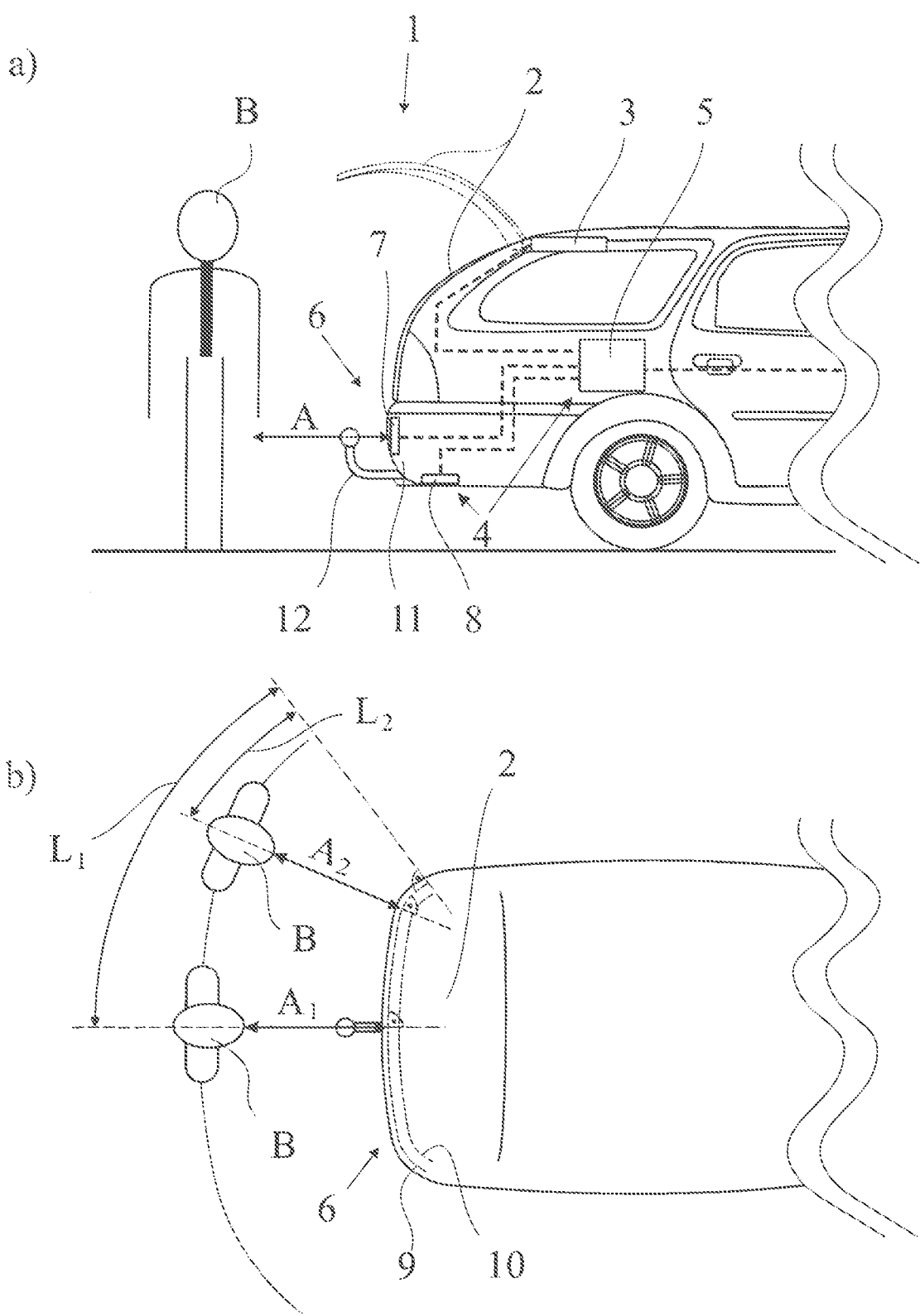
FIG. 1 shows a) the rear region of a motor vehicle with a closure element arrangement for carrying out the proposed methods in a side view and b) this rear region in a plan view.

The tailgate 2 is assigned a drive arrangement 3 by means of which here and one motor adjustment of the tailgate 2 can be brought about between the closed position illustrated as an unbroken line in FIG. 1 and the open position illustrated as a dashed line in FIG. 1. However, it is also basically conceivable that the drive arrangement 3 be a component of a motor vehicle lock which is assigned to the tailgate 2 and that corresponding actuation of the drive arrangement 3 triggers the opening of the motor vehicle lock and, if appropriate, the spring-operated adjustment of the tailgate 2. In this respect, the term "drive arrangement" is to be understood in a broad fashion here.

In addition, a control system 4 with a controller 5 and a sensor arrangement 6 is provided. The sensor arrangement 6 has at least an elongate distance sensor 7, 8, here and two elongate distance sensors 7, 8 (FIG. 1a)), each with a sensor extent 9, 10 (FIG. 1b)). The distance sensors 7, 8 run essentially one next to the other, but at a distance from one another. By means of the distance sensors 7, 8 it is possible to detect in each case a distance A from a user B transversely with respect to the sensor extent 9, 10, which user is located at a longitudinal position L along the respective sensor extent 9, 10.

The present meaning of the terms "sensor extent", "distance A" and "longitudinal position L" is explained below with reference to the illustration according to FIG. 1b). From the distances $A_1$ and $A_2$ it can be inferred that the distances are detected transversely with respect to the section of the sensor extent 9 of the distance sensor 7 which is currently relevant for the user B. This allows for the fact that the distance sensors 7, 8 in question here, which are capacitive distance sensors, detect the distance primarily perpendicularly with respect to their respective sensor extent 9, 10. Correspondingly, the direction of the detection of the distance changes with the longitudinal position L of the user B depending on the geometry of the distance sensors 7, 8.

The longitudinal position L is the position of the user B along the respective sensor extent 9, 10. It is to be borne in mind here that the user B can assume a longitudinal position L at different distances from the respective distance sensor 7, 8.

Certain user movements are defined here as operator control events which are each intended to trigger a certain reaction of the controller 5 and therefore of the drive arrangement 3. The operator control event can be a movement of the user's foot which will be explained below.

In order to be able to react to the presence of operator control events as discussed above, an operator control event monitoring operation is provided which is carried out by the controller 5. Within the scope of the operator control monitoring operation, the controller 5 monitors the sensor measured values of the distance sensors 7, 8 to determine whether or not a predetermined operator control event occurs. Corresponding actuation of the drive arrangement 3, for example the opening of the tailgate 2 by motor, is performed as a function of the result of the operator control event monitoring operation.

It is essential that at least two elongate sensor sections 7a, 7b, running essentially one next to the other, of the at least one distance sensor 7 are provided. The term "running essentially one next to the other" is to be understood here in a broad fashion. In particular, a parallel orientation of the two sensor sections 7a, 7b with one another is not necessarily meant by this.

The two sensor sections 7a, 7b are each configured to detect a distance A from a user B. Strictly speaking, the sensor sections 7a, 7b are each a distance sensor in the above sense. The detection of distances on which the operator control event monitoring operation is based can be based, for example, on the addition of the sensor measured values of the two sensor sections 7a, 7b.

According to the proposal the sensor sections 7a, 7b have changing sensor configurations along the sensor extent 9. This can be seen most easily from the illustration according to FIG. 3 in which the effective area of the sensor sections 7a, 7b changes along the sensor extent 9. A detailed explanation of the changing of the sensor configurations is given below.

It is also essential that the longitudinal position L of the user B is determined as a function of the sensor measured values of the at least two sensor sections 7a, 7b, here the precisely two sensor sections 7a, 7b, by means of the controller 5. It is an interesting fact here that this determination of the longitudinal position L of the user B is largely independent of the respective current distance of the user B from the distance sensor 7.

The longitudinal position L of the user B can be used in entirely different ways. According to a further teaching, which has independent significance, there is provision that the operator control event monitoring operation is modified as a function of the longitudinal position L of the user B. As a result, the operator control event monitoring operation can be adapted in an optimum way to the given conditions at the respective longitudinal position L.

It is to be noted that according to the further teaching the way in which the longitudinal position L of the user B has been determined is not significant. Basically the use of an additional sensor is conceivable here. However, in an embodiment the determination of the longitudinal position L of the user B is performed according to the teaching mentioned first.

According to the implementation of the change in the sensor configurations which is provided along the sensor extent 7, the longitudinal position L of the user B can be determined in different ways. In one embodiment the determination of the longitudinal position L of the user B is based on a division of the sensor measured values of two sensor sections 7a, 7b. It is alternatively possible to provide that the determination of the longitudinal position L of the user B is based on the difference between the sensor measured values of the two sensor sections 7a, 7b. The above division or the above difference can have the effect that the distance A of the user B from the distance sensor 7 only then has a negligible influence on the determined longitudinal position L.

Another variant provides that the determination of the longitudinal position L of the user B is based on the difference between the phase shifts between the voltage and current in the sensor measured values of two sensor sections 7a, 7b. This can be attributed, for example, to the fact that the ohmic resistance between a lateral connection here and a longitudinal section of the sensor sections 7a, 7b which is assigned to the longitudinal position of the user B depends on the distance between the connection and the longitudinal section. In addition, the phase shift can be influenced selectively by suitable selection of material for the sensor sections 7a, 7b. It may be advantageous, for example, to use a material with a relatively high electrical resistance for the sensor sections 7a, 7b at locations with a high desired measuring resolution, in particular in the central region of the motor vehicle. Finally, it is conceivable that the sensor sections 7a, 7b are provided with different coatings along their sensor extent 9, which coatings can also bring about a selective change in the phase shift during the operation of the sensor section 7a, 7b as a capacitive sensor.

Numerous variants are conceivable for the modification of the operator control event monitoring operation referred to above. In one embodiment, it is assumed that an operator control event model composed of signal characteristic values is assigned to an operator control event, wherein within the scope of the operator control event monitoring operation the controller 5 monitors whether the sensor measured values correspond to the signal characteristic values of the operator control event model. Such an operator control event model represents to a certain extent the shape or the profile of the sensor measured values during an operator control event. It is now proposed that the operator control event model be generated as a function of the longitudinal position L of the user B or be selected as a function of the longitudinal position L of the user B from a number of stored operator control event models or be parameterized as a function of the longitudinal position L of the user B.

In the simplest case, an operator control event is assigned an operator control event characteristic value set composed of signal characteristic values which are in turn matched with the sensor measured values within the scope of the operator control event monitoring operation. The operator control event characteristic value set is a simple form of an operator control event model. According to the proposal, modification of the operator control event characteristic value set as a function of the longitudinal position L of the user B is correspondingly proposed.

In an embodiment, the modification of the operator control event monitoring operation can relate to the signal processing method on which the determination of the sensor measured values by means of the controller 5 is based. There is provision here that the signal processing method is defined by a signal processing parameter set with signal processing parameters such as a minimum signal level, a chronological measuring resolution or amplitude measuring resolution. According to the proposal, the signal processing parameter set can be selected from a number of stored signal processing parameter sets as a function of the longitudinal position L of the user B, or is parameterized as a function of the longitudinal position L of the user B.

It is also conceivable that the modification of the operator control event monitoring operation relates to the evaluation of the digitized sensor measured values. In particular, the operator control event monitoring operation firstly comprises here the digitization of the sensor measured values, wherein the subsequent evaluation of the digitized measurement data, in particular the matching with an operator control event characteristic value set, is carried out on the basis of a corresponding evaluation method. The evaluation method is defined by an evaluation parameter set with evaluation parameters such as the computational accuracy or the type of matching algorithm. It is also proposed here that the evaluation parameter set be selected as a function of the longitudinal position L of the user B from a number of stored evaluation parameter sets or be parameterized as a function of the longitudinal position L of the user B.

The proposed modification of the operator control event monitoring operation can basically also relate to the actuation of the sensor arrangement 6. The term "actuation" is to be understood in a broad sense here and relates to all technical control measures which lead to the determination of the sensor measured values. In particular it is proposed here that within the scope of the operator control event monitoring operation the sensor arrangement 6 be actuated by means of the controller 5 as a function of the longitudinal position L of the user B.

However, it may also basically be quite generally provided that the modification of the operator control event monitoring operation is carried out on the modification of what is referred to as "plausibility checking". Such plausibility checking comprises predetermined conditions whose occurrence speaks for or against the presence of an operator control event. It will be conceivable here that different plausibility conditions are applied as a function of the longitudinal position L of the user B.

Figure 2:
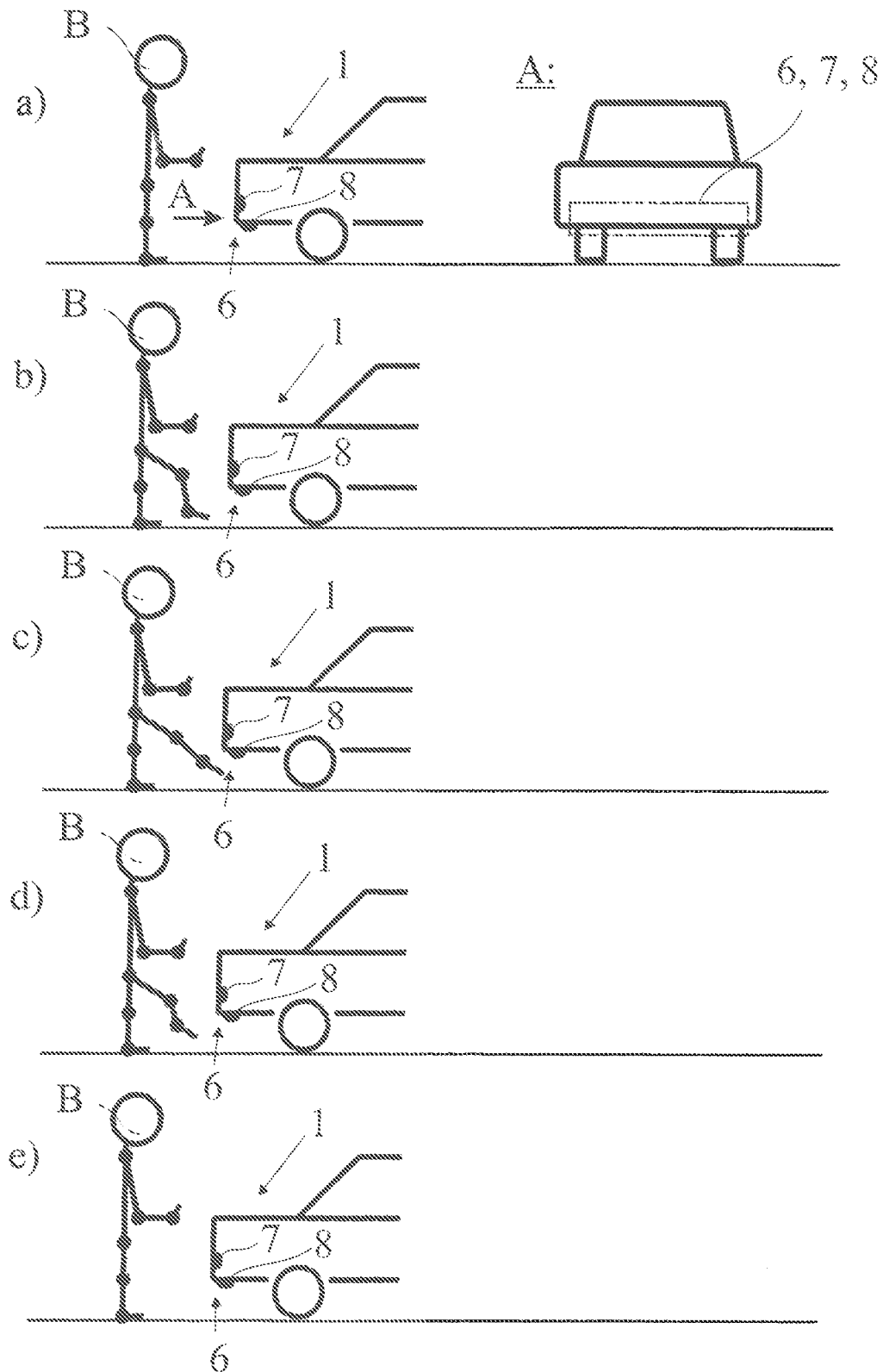
FIG. 2 shows a sequence of a proposed operator control event, to be detected, in the five stages a) to e)

According to FIG. 2, at least one operator control event is defined as a movement of the user's B foot. In this context, at least one distance sensor 7, 8 is arranged in or on a rear cover part 11, at the rear bumper 11, of the motor vehicle. The at least one distance sensor 7, 8 can extend over a significant part of the width of the motor vehicle, as is apparent from the illustration according to FIG. 2a).

In particular at least one operator control event can be defined as a to and fro movement of the user's foot. FIG. 2 shows in figures a) to e) the stations of the sequence of such an operator control event which comprises a to and fro movement of the user's foot. Such a movement of the foot can generate a pulse-like time profile in the sensor measured values of the distance sensors 7, 8, which time profile is evaluated within the scope of the operator control event monitoring operation.

The structural configuration of the control system 4, that is to say of the controller 5, on the one hand, and of the sensor arrangement 6, on the other, has quite particular significance here. Accordingly, the control system 4 is a subject matter of a further, independent teaching. With respect to this further teaching, reference is made to the explanation of the proposed methods in so far as these are suitable to explain the control system 4.

The implementation of the above-mentioned two elongate sensor sections 7a, 7b, running essentially one next to the other, of the at least one distance sensor 7, 8, which sensor sections 7a, 7b are each configured to detect a distance A from a user B, is significant for the proposed control system. In this context, the sensor sections 7, 8 along the sensor extent 9, 10 have changing sensor configurations such that the longitudinal position L of the user B can be determined as a function of the sensor measured values of the at least two sensor sections 7a, 7b by means of the controller 5. What is significant is therefore a quite specific sensor configuration which changes along the sensor extent 9 and which permits determination of the longitudinal position L of the user B.

In one embodiment it is even the case that the current longitudinal position L of the user B can be determined exclusively as a function of the current sensor measured values of the at least two sensor sections 7a, 7b by means of the controller 5. Accordingly, only the measurement of a single measured value pair is necessary to determine the longitudinal position L of the user B.

Basically it is possible to provide that the changing of the sensor configuration along the sensor extent 9 is carried out in such a way that the longitudinal position L of the user B as a function of the sensor measured values of the sensor sections 7a, 7b can be determined continuously along the sensor extent. Precise determination of the longitudinal position L of the user B over the entire sensor extent 9 is therefore possible. Accordingly, a correspondingly continuous change of the sensor configuration will be necessary.

However, it can also alternatively be provided that the changing of the sensor configuration along the sensor extent 9 is carried out in such a way that the longitudinal position L of the user B as a function of the sensor measured values of at least two sensor sections 7a, 7b can be assigned to at least two different longitudinal sections along the sensor extent 9. This means that the changing of the sensor configuration along the sensor extent 9 is also necessary only in sections. This may be advantageous if an attachment component, such as a trailer coupling 12, is located in a longitudinal section of the distance sensor 7 or can be mounted there. It is therefore possible to react to the position of the user B in the longitudinal position of the trailer coupling 12 by means of control technology, as mentioned above.

Figure 3:
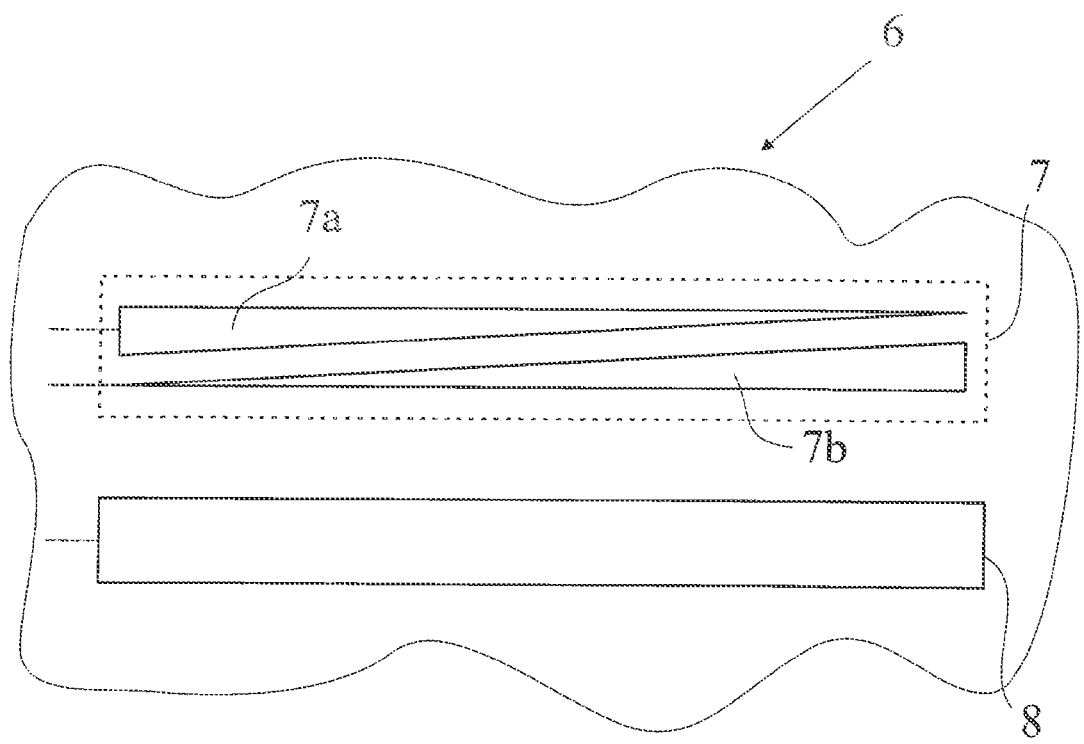
FIG. 3 shows an entirely schematic illustration of a detail from the rear apron of the rear region according to FIG. 1 in an end-side view in a first embodiment.
Figure 4:
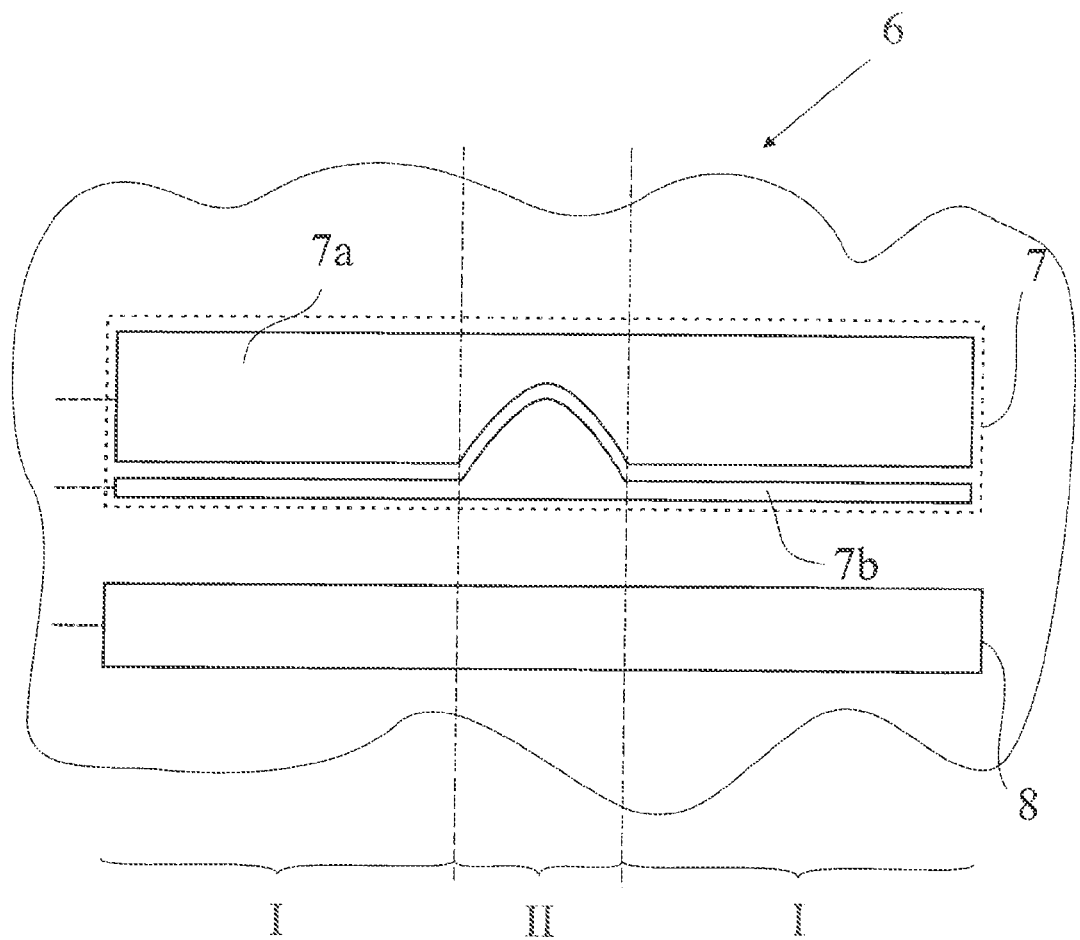
FIG. 4 shows an entirely schematic illustration of a detail from the rear apron of the rear region according to FIG. 1 in an end-side view in a second embodiment.
Figure 5:
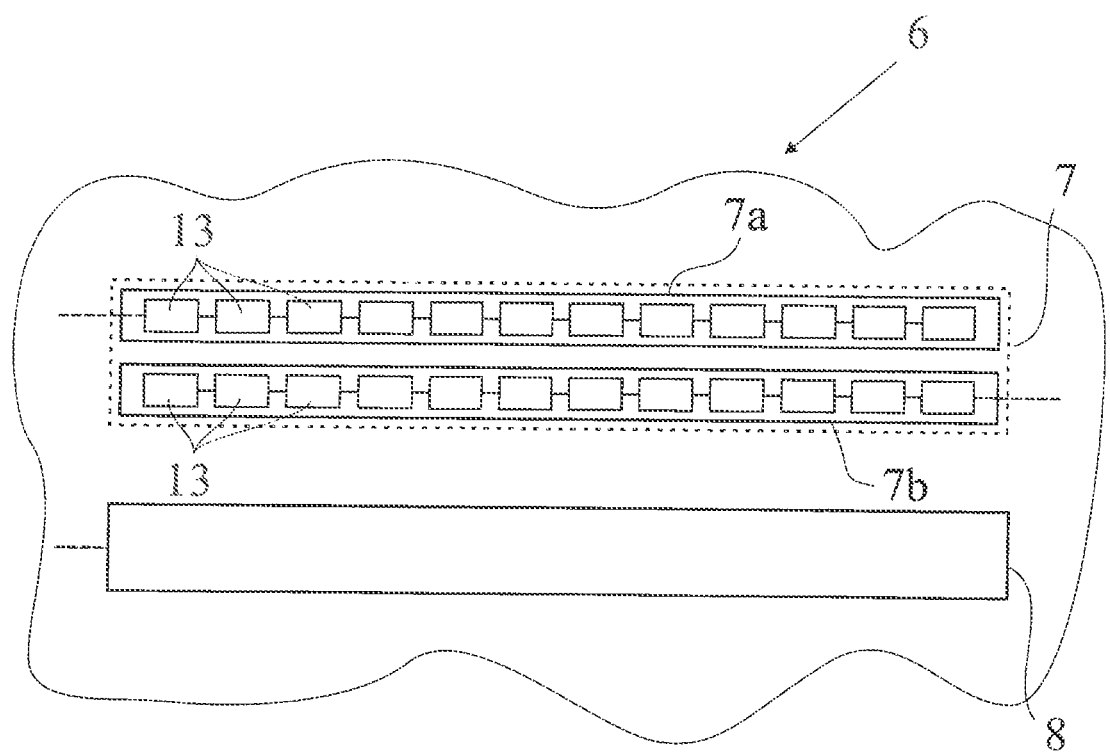
FIG. 5 shows an entirely schematic illustration of a detail from the rear apron of the rear region according to FIG. 1 in an end-side view in a third embodiment.

Three variants of a sensor arrangement 6 with two distance sensors 7, 8 are shown by FIGS. 3, 4 and 5. In all the illustrated embodiments, the distance sensors 7, 8 and the corresponding sensor sections 7a, 7b are capacitive sensors which have at least one elongate measuring electrode and here are even merely composed of such a measuring electrode.

The measuring electrodes are in turn composed of at least one, and in FIGS. 3 and 4 of precisely one electrical conductor. In the exemplary embodiments illustrated in FIGS. 3 and 4, a first sensor section 7a has a first measuring electrode, and a second sensor section 7b correspondingly has a second measuring electrode. The distance sensors 7, 8 and the sensor sections 7a, 7b are configured as measuring electrodes, as mentioned above, and are connected at the end to the controller 5. This is indicated by a dashed line in FIGS. 3 to 5. The connection of the measuring electrodes can also basically be provided on both sides.

It has already been noted that the sensor configuration comprises all the parameters which can have some sort of effect on the sensor measured values. Accordingly, the sensor configuration of a sensor section 7a, 7b is based, for example, on its geometry, its position, its material composition or the like.

In the exemplary embodiment of the sensor sections 7a, 7b which make available capacitive sensors, the changing of the sensor configuration can be achieved particularly easily by changing the geometry of the measuring electrode along the sensor extent 9. It can be the case here that the effective area of the measuring electrode changes, here and continuously, along the sensor extent 9. This can be seen best in the illustration according to FIG. 3. The term "effective area" comprises exclusively the areas which experience a capacitive effect within the scope of the capacitive distance sensor. Areas which do not make a contribution during the capacitive detection of distance are not included by this.

The effective area of the sensor section 7a reduces continuously from one end to the other end of the sensor section 7a. The effective area of the other sensor section 7b also changes continuously but in the opposite direction to the changing of the effective area of the previously mentioned sensor section 7a. Another variant for changing the sensor configuration along the sensor extent 9 is based on a corresponding change in the material composition of the respective measuring electrode along the sensor extent 9. In an embodiment, a lining, in particular a conductive lining with an ohmic resistance, changes, in particular continuously, along the sensor extent 9. When an alternating voltage is applied, a real part of the resulting complex resistance which depends on the longitudinal position L of the user B is therefore produced. This can be utilized as capacitive sensors during the operation of the sensor sections 7a, 7b in order to be able to draw a conclusion about the longitudinal position L of the user B from the differences in the phase shift between the voltage and the current.

A further embodiment according to FIG. 4 wherein it is possible to determine whether the user is located in region II or in region I is also of interest. FIG. 4 shows that the sensor configuration changes exclusively in the region II, with the result that it is not possible to differentiate with the proposed method between the part of region I which is on the left in FIG. 4 and the part of region I which is on the right in FIG. 4. This differentiation is, however, not necessary here since all that is significant is to determine whether the user B is located in the longitudinal position L of the trailer coupling 12, that is to say in the region II. The changing of the sensor configuration has also been achieved here by changing the effective area of the sensor sections 7a, 7b.

Here the sensor sections 7a, 7b each can extend over the entire sensor extent 9. However, it may basically also be provided that the sensor sections 7a, 7b cover only a part of the entire sensor extent 9.

FIG. 5 shows that the sensor sections 7a, 7b have a plurality of section parts 13 which can be connected electrically in series here. The individual section parts 13 are simply connected by one electrical conductor. It is conceivable, for example, that the individual section parts 13 have different effective areas. However, it can be the case here that the individual section parts 13 are coated with a resistance material in different ways, in the above sense.

In the illustrated exemplary embodiments, the two sensor sections 7a, 7b are assigned to a single distance sensor 7, to the respective upper distance sensor 7 in the drawing. It is always correspondingly the case that one of the two distance sensors 7, 8 has the two sensor sections 7a, 7b. However, it may alternatively also be provided that the one distance sensor 7 has the one sensor section 7a, and the other distance sensor 8 has the other sensor section 7b. Other sensor structures may be provided depending on the application.

In one particular embodiment, the sensor configuration of the respective sensor section 7a, 7b which changes along the sensor extent 9 gives rise to a sensitivity profile of the respective sensor section 7a, 7b which changes along the sensor extent 9. The term "sensitivity" is to be understood here in an extended sense such that a change in the sensitivity given an identical distance A from the user B always entails a corresponding change in the sensor measured value. The term "sensitivity profile" also means that sensitivity in the above sense changes in any case at a location along the sensor extent 9. Basically, the sensitivity can therefore be constant at least at certain locations, or even be zero. In the last-mentioned case, the distance sensor 7, 8 or the respective sensor section 7a, 7b does not react to the approaching of a user B.

Finally, it is to be noted that the proposed teachings are not restricted to the field of application of a motor vehicle. Instead, numerous other fields of application are conceivable, for example the field of application of home automation.

The invention claimed is:

1. A method for actuating a closure element arrangement of a motor vehicle, wherein the closure element arrangement has a closure element, a drive arrangement assigned to the closure element, and a control system having a controller and a sensor arrangement, wherein the sensor arrangement has at least one elongate distance sensor with a sensor extent, the method comprising:
    detecting with the at least one distance sensor a transverse distance from a user with respect to the sensor extent, wherein the user is located at a longitudinal position along the sensor extent, wherein at least two elongate sensor sections, running essentially one next to the other, of the at least one distance sensor are provided, which sensor sections are each configured to detect the distance from the user, and wherein the sensor sections have changing sensor configurations along the sensor extent;
    determining, with the controller, the longitudinal position of the user based on the sensor measured values of the at least two sensor sections;
    monitoring, with the controller, the sensor measured values of the at least one distance sensor within the scope of an operator control event monitoring operation, to determine whether a predetermined operator control event occurs; and
    actuating the drive arrangement based on the result of the operator control event monitoring operation.

2. The method according to claim 1, further comprising modifying the operator control event monitoring operation based on the longitudinal position of the user.

3. The method according to claim 1, wherein determining the longitudinal position of the user is based on an arithmetic operation between the sensor measured values of two sensor sections.

4. The method according to claim 1, wherein determining the longitudinal position of the user is based on the difference between the phase shifts between the voltage and the current in the sensor measured values of two sensor sections.

5. The method according claim 1, further comprising assigning an operator control event model composed of signal characteristic values to an operator control event, wherein within the scope of the operator control event monitoring operation the controller monitors whether the sensor measured values correspond to the signal characteristic values of the operator control event model, and further comprising generating the operator control event model based on the longitudinal position of the user, or selecting the operator control event model based on the longitudinal position of the user from a number of stored operator control event models, or parameterizing the operator control event model based on the longitudinal position of the user.

6. The method according to claim 1, wherein at least one operator control event is defined as a foot movement of the user.

7. A control system for a closure element arrangement of a motor vehicle, wherein the closure element arrangement has a closure element and a drive arrangement assigned to the closure element, wherein the control system has a controller and a sensor arrangement, wherein the sensor arrangement has at least one elongate distance sensor with a sensor extent, wherein a distance from a user can be detected transversely with respect to the sensor extent by means of the distance sensor, wherein the user is located at a longitudinal position along the sensor extent, wherein, within the scope of an operator control event monitoring operation, the controller monitors the sensor measured values of the sensor arrangement to determine whether a predetermined operator control event occurs and actuates the drive arrangement based on the result of the operator control event monitoring operation, wherein at least two elongate sensor sections, running essentially one next to the other, of the at least one distance sensor are provided, which sensor sections are each configured to detect the distance from the user, in that the sensor sections have changing sensor configurations along the sensor extent such that the longitudinal position of the user can be determined based on the sensor measured values of the at least two sensor sections by means of the controller.

8. The control system according to claim 7, wherein the current longitudinal position of the user can be determined exclusively based on the current sensor measured values of the at least two sensor sections by means of the controller.

9. The control system according to claim 7, wherein the change in the sensor configuration along the sensor extent is made in such a way that the longitudinal position of the user can be determined continuously along the sensor extent based on the sensor measured values of at least two sensor sections, or in that the change in the sensor configuration along the sensor extent is made in such a way that the longitudinal position of the user can be assigned to at least two different longitudinal sections along the sensor extent based on the sensor measured values of at least two sensor sections.

10. The control system according to claim 7, wherein the sensor sections each extend over the entire sensor extent, and/or in that a sensor section has a plurality of section parts.

11. The control system according to claim 7, wherein the at least one distance sensor is configured as a capacitive distance sensor and has at least one elongate measuring electrode which is composed of at least one electrical conductor.

12. The control system according to claim 11, wherein the sensor configuration of a sensor section is based on its geometry, its position, or its material composition.

13. The control system according to claim 11, wherein in order to change the sensor configuration the geometry of the measuring electrode changes along the sensor extent.

14. The control system according to claim 12, wherein in order to change the sensor configuration the material composition of the measuring electrode changes along the sensor extent.

15. The control system according to claim 7, wherein two distance sensors which run essentially one next to the other are provided, and in that one of the two distance sensors has the at least two sensor sections, or in that one distance sensor has one sensor section, and the other distance sensor has the other sensor section.

16. The control system according to claim 7, wherein the sensor configuration of the sensor section which changes along the sensor extent gives rise to a sensitivity profile of the sensor section which changes along the sensor extent.

17. The method according to claim 3, wherein determining the longitudinal position of the user is based on a division of the sensor measured values of two sensor sections, or wherein determining the longitudinal position of the user is based on the difference between the sensor measured values of two sensor sections.

18. The method according to claim 6, wherein the at least one distance sensor is arranged in or on a rear cover part of a motor vehicle.

19. The control system according to claim 9, wherein a trailer coupling is located or mounted in a longitudinal section.

20. A method for actuating a closure element arrangement of a motor vehicle, wherein the closure element arrangement has a closure element, a drive arrangement assigned to the closure element, and a control system having a controller and a sensor arrangement, wherein the sensor arrangement has at least one elongate distance sensor with a sensor extent, the method comprising:

detecting with the at least one distance sensor a transverse distance from a user with respect to the sensor extent, wherein the user is located at a longitudinal position along the sensor extent;

determining, with the controller, the longitudinal position of the user;

monitoring, with the controller, the sensor measured values of the at least one distance sensor within the scope of an operator control event monitoring operation, to determine whether a predetermined operator control event occurs;

modifying the operator control event monitoring operation based on the longitudinal position of the user, and actuating the drive arrangement based on the result of the operator control event monitoring operation.

\* \* \* \* \*